US012740462B2

(12) United States Patent
Kim et al.

(10) Patent No.: US 12,740,462 B2
(45) Date of Patent: Sep. 15, 2026

(54) PACKAGING SUBSTRATE, METHOD OF MANUFACTURING AN ELEMENT PACKAGE AND METHOD OF MANUFACTURING PACKAGING SUBSTRATE

(71) Applicant: Absolics Inc., Covington, GA (US)

(72) Inventors: Sungjin Kim, Covington, GA (US); Si Hun Lee, Hwaseong-si (KR)

(73) Assignee: Absolics Inc., Covington, GA (US)

(*) Notice: Subject to any disclaimer, the term of this patent is extended or adjusted under 35 U.S.C. 154(b) by 343 days.

(21) Appl. No.: 18/476,328

(22) Filed: Sep. 28, 2023

(65) Prior Publication Data

US 2025/0112098 A1 Apr. 3, 2025

(51) Int. Cl.
*H01L 23/15* (2006.01)
*H01L 23/00* (2006.01)
(Continued)

(52) U.S. Cl.
CPC ....... *H10W 70/692* (2026.01); *H10W 70/685* (2026.01); *H10W 74/124* (2026.01);
(Continued)

(58) Field of Classification Search
CPC . H01L 23/15; H01L 23/315; H01L 23/49822; H01L 24/16; H01L 24/32; H01L 2224/16235; H01L 2224/32146; H01L 2224/32235; H01L 2924/01029; H01L 2924/1431; H01L 2924/1434; H01L 23/3121; H01L 23/5389; H01L 25/0655; H01L 2924/00; H01L 2924/00014;
(Continued)

(56) References Cited

U.S. PATENT DOCUMENTS 5,166,228 A * 11/1992 Shiobara ................ C08G 59/08 525/481
2020/0161248 A1 5/2020 Lee et al.
(Continued)

FOREIGN PATENT DOCUMENTS

JP 2001313467 11/2001
JP 2002110718 4/2002
(Continued)

*Primary Examiner* — Leonardo Andujar
(74) *Attorney, Agent, or Firm* — JCIP GLOBAL INC.

(57) ABSTRACT

The present specification relates to a method of manufacturing a packaging substrate and a packaging substrate manufactured thereby. The packaging substrate according to the present specification includes a core layer comprising a glass core and a cavity portion, wherein the glass core is a glass substrate having a first surface and a second surface facing each other, the cavity portion has an accommodation space for accommodating an electronic element as a part of the glass core is recessed or penetrated, and the element package is placed in the accommodation space of the cavity portion, wherein the element package comprises i) a plurality of arranged electronic elements; and ii) a molding portion containing a molding material and the molding portion arranges for the molding material to surround the electronic elements, and a concave portion having arranged dimples is disposed in some of the molding portion at the element package.

12 Claims, 13 Drawing Sheets

(51) Int. Cl.

| | |
|---|---|
| ***H01L 23/31*** | (2006.01) |
| ***H01L 23/498*** | (2006.01) |
| ***H10W 70/685*** | (2026.01) |
| ***H10W 70/692*** | (2026.01) |
| ***H10W 74/10*** | (2026.01) |
| *H10W 90/00* | (2026.01) |

(52) U.S. Cl.
CPC ........ *H10W 90/724* (2026.01); *H10W 90/732* (2026.01); *H10W 90/734* (2026.01)

(58) Field of Classification Search
CPC ..... H01L 21/565; H01L 23/13; H01L 23/293; H01L 23/3157; H01L 23/49838
See application file for complete search history.

(56) References Cited

U.S. PATENT DOCUMENTS

| | | | | |
|---|---|---|---|---|
| 2020/0335460 | A1 | 10/2020 | Lee et al. | |
| 2021/0057298 | A1 | 2/2021 | Tsai et al. | |
| 2022/0051972 | A1* | 2/2022 | Kim | H01L 23/49822 |
| 2022/0082939 | A1 | 3/2022 | Liao et al. | |
| 2022/0293560 | A1 | 9/2022 | Chen et al. | |
| 2022/0352046 | A1 | 11/2022 | Tseng et al. | |

FOREIGN PATENT DOCUMENTS

| | | | | |
|---|---|---|---|---|
| JP | 2003229443 | | 8/2003 | |
| JP | 2014187125 | | 10/2014 | |
| JP | 2014204040 | | 10/2014 | |
| JP | 2014204040 | A * | 10/2014 | H01L 21/565 |
| JP | 2017082104 | | 5/2017 | |
| JP | 2022517061 | | 3/2022 | |
| KR | 101770464 | | 8/2017 | |
| KR | 20200058129 | | 5/2020 | |
| KR | 20220060557 | | 5/2022 | |
| KR | 20230029115 | | 3/2023 | |
| WO | 2019073801 | | 4/2019 | |

* cited by examiner (a)
21d
23a
21a (b)
23b
23a
21a
21d
223

(c)
23a
21a
21d
223

(d)
23d
23c
23a
21a
21d
223

(e)

PACKAGING SUBSTRATE, METHOD OF MANUFACTURING AN ELEMENT PACKAGE AND METHOD OF MANUFACTURING PACKAGING SUBSTRATE

BACKGROUND

1. Field of the Invention

The present disclosure relates to a packaging substrate, a method of manufacturing an element package, a method of manufacturing a packaging substrate, and the like.

2. Discussion of Related Art

In manufacturing electronic components, implementing a circuit on a semiconductor wafer is called as a front-end (FE) process, assembling the wafer in a state of being usable in an actual product is called as a back-end (BE) process. A packaging process is included in subsequent processes.

Four core technologies of semiconductor industry which recently enabled rapid development of electronic products include semiconductor technology, semiconductor packaging technology, manufacturing process technology, and software technology. Semiconductor technology has developed in various forms, such as nanoscale (submicron) line widths, 10 million cells or more, high-speed operation, large heat dissipation, and the like, but a relatively perfect packaging technology is not fully supported. Accordingly, the electrical performance of a semiconductor can sometimes be determined by the packaging technology and the electrical connection according to the packaging technology rather than performance of the semiconductor technology itself.

A ceramic or resin has been applied as a material of a substrate for packaging. In the case of a ceramic substrate such as a silicon substrate, it is difficult to mount a high-performance and high-frequency semiconductor element due to a high resistance value or high dielectric permittivity. In the case of a resin substrate, a relatively high-performance and high-frequency semiconductor element can be mounted. However, there is a limitation in pitch reduction of lines.

Recently, glass plate has been applied to a substrate for high-end packaging. A line length between an element and a motherboard can be shortened and electrical characteristics can become excellent by forming a through hole in a glass substrate and applying a conductive material to the through hole.

RELATED ART DOCUMENTS

Patent Documents

US Patent Laid-Open Application US20220293560A1

Korean Patent Laid-Open Application No. 10-2018-0142742

SUMMARY OF THE INVENTION

An embodiment is directed to providing a packaging substrate using a glass core in which an element package (element molding package) with a concave portion is inserted into a cavity part, and to providing a method of manufacturing a packaging substrate.

Further, an embodiment is directed to providing a method of manufacturing an element package that maintains an arranged distance of elements using a mold with a protrusion formed on the mold and a packaging substrate using it.

In order to achieve the above object, one embodiment relates to a method of manufacturing an element package and a packaging substrate using the same.

A packaging substrate according to the present specification includes a core layer, the core layer includes a glass core and a cavity portion, the glass core is a glass substrate having a first surface and a second surface facing each other, the cavity portion has an accommodation space by recessing or penetrating a portion of the glass core, elements are disposed at the accommodation space of the cavity portion, and the element package includes i) a plurality of arranged electronic elements; and ii) a molding portion in which the molding material is disposed to surround the electronic elements, and the element package includes a concave portion having arranged dimples in the molding portion.

The dimples may be disposed between adjacent electronic elements.

The concave portion may include dimples that a plurality of the dimples is arranged in a dotted line when viewed from the first surface to the second surface.

The packaging substrate may further include an insulating layer disposed in the cavity portion.

An insulating material of the insulating layer may be recessed in the dimples of the concave portion.

The molding material may include liquid crystal polymer (LCP), epoxy molding compound (EMC), Ajinomoto Build-up Film (ABF), or Modified Polyimide (MPI).

The insulating layer may include an insulating mixture, and the insulating mixture may include inorganic particles and a polymer resin.

A boundary between the molding portion and the insulating layer may be positioned in the cavity portion.

A concave portion having arranged dimples concaved in the direction of the electronic element may be disposed at the boundary.

Meanwhile, in order to achieve the above objectives, a method of manufacturing an element package according to an embodiment includes an element arrangement operation in which a mold with an inlet is prepared and electronic element s are placed at a predetermined position on the mold; an injection operation of injecting molding material into the inlet; and a mold forming operation of forming a molding portion by curing the molding material, and manufactures an element package as described the above.

The mold has a protrusion portion having arranged protrusions around the inlet, the element package includes two or more arranged electronic elements and a molding portion, the molding portion has a molding material arranged to surround the electronic elements, and the molding portion has a concave portion having arranged dimples. The concave portion and the protrusion portion have positions corresponding to each other.

In the element arrangement operation, the electronic elements may be disposed on an adhesive surface to be fixed in position.

The position where the electronic elements are disposed in the mold forming operation is substantially the same as the position where the electronic elements are disposed in the element arrangement operation.

The protrusions may be disposed between adjacent electronic elements.

Meanwhile, the manufacturing method of the packaging substrate according to one embodiment manufactures the aforementioned packaging substrate, including preparing a glass core and an element package with a cavity portion, placing the element package in the cavity portion, and forming an insulating layer by placing and curing an insulating material on the glass core or the cavity portion.

In the operation of forming the insulating layer, the insulating material may flow, and a part thereof may be moved to dimples of a concave portion on the cavity element.

A method of manufacturing a packaging substrate of an embodiment and a packaging substrate using the same may generate an element molding package while maintaining a gap between electronic elements, thereby preventing a short circuit of the electronic element.

In addition, the mold with a protrusion potion formed on the top can be used to prevent the location of electronic elements from changing during the molding process, thereby preventing contact of electronic elements to prevent problems such as short circuits.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
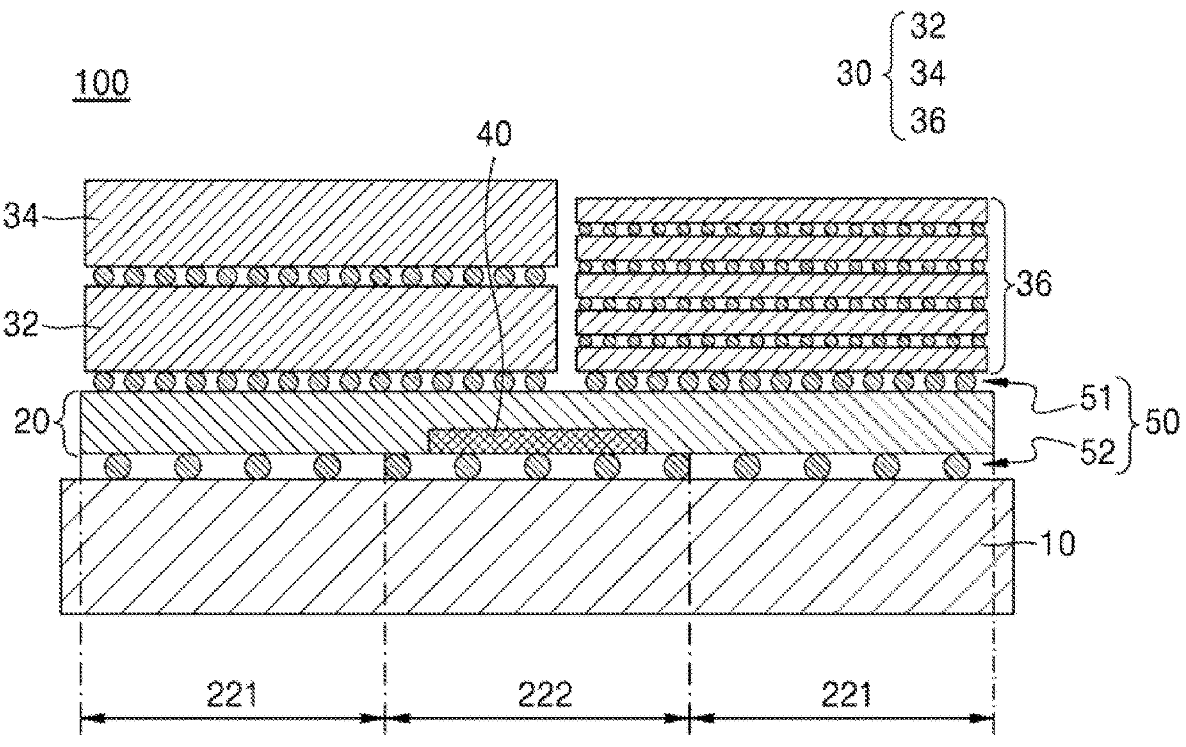
FIG. 1 is a conceptual diagram illustrating a cross-sectional structure of a packaging substrate according to an embodiment.

In order to help comprehensive understanding of methods, devices and/or systems described in the present specification, the following detailed description is provided. However, various changes, modifications and equivalents of the methods, devices and/or systems described in the present specification will become apparent after understanding the contents written in the present specification. For example, an order of operations described in the present specification is merely exemplary, and is not limited to the operations disclosed in the present specification. The order of operations except for operations necessarily performed in a predetermined order may be changed according to the understanding of the contents written in the present application. Further, descriptions of already known features may be omitted to increase clarity and conciseness after understanding the disclosed contents of the present application. However, omitting the features and the descriptions is not intended to be recognized as general knowledge.

Features described in the present specification may be realized in different forms, and are not interpreted as being limited to examples described in the present specification. On the contrary, the embodiments described in the present specification are provided to describe some of the many possible methods, and implementation methods of devices and/or systems described in the present specification which will become apparent after understanding the present application.

In the present specification, terms "first," "second," "third," and the like may be used to describe various members, components, regions, layers or cross-sections, but the members, components, regions, layers, or cross-sections, are not limited by these terms. Alternatively, these terms are used to distinguish one member, component, region, layer, or section from another member, component, region, layer, or section. Accordingly, a first member, component, region, layer, or section mentioned in the embodiments described in the present specification may also be referred to as a second member, component, region, layer, or section without departing from teachings of the embodiments.

Throughout the specification, a case in which a component such as a layer, region, or substrate is described as "on," "connected to," or "coupled to" another component, may be described as directly "on," "connected to," or "coupled to" another component, or may be described as "on," "connected to," or "coupled to" another component with one or more other component interposed therebetween. On the contrary, when any component is described as "directly on," "directly connected to," or "directly coupled to," other components may not be interposed. Likewise, for example, terms such as "between" and "directly between," and "in contact with each other" and "directly in contact with each other" may be interpreted as described above.

Terms used the present specification are only for describing specific examples and are not used to limit the disclosure. A singular form used in the present specification is intended to also include a plural form unless the context clearly indicates otherwise. A term "and/or" includes any one or combination of two or more of related listed items. Terms "includes," "constitutes," and "has" indicate the presence of specified features, numbers, operations, elements, components, and/or combinations thereof, but do not preclude the presence or addition of one or more other features, numbers, operations, elements, and/or combinations thereof. Use of the term "may" in the present specification in relation to an example or embodiment (for example, for what the example or embodiment may include or implement) refers to at least one example or embodiment in which this feature is included or realized is present, but not all examples are limited thereto.

In the present application, a case in which "B is located on A" refers to a case in which B comes into direct contact with A or a case in which B is disposed on A with another layer or structure interposed therebetween, and accordingly, the case in which B is disposed on A with another layer or structure interposed therebetween should not be interpreted as a case in which B comes into direct contact with A.

Unless otherwise defined, all terms used in the present specification have the same meaning as generally understood by those skilled in the art. Terms such as terms defined in generally used dictionaries should be interpreted as having meanings consistent with the meanings in the context of the related art and the present disclosure and should not be idealized or interpreted as excessively formal meanings unless otherwise explicitly defined.

In the one or more examples, descriptions for "A and/or B" refer to "A, B or A and B."

In the one or more examples, the term "first," "second," "A," or "B" is used to distinguish the same terms from each other.

In the one or more examples, a singular form is contextually interpreted as including a plural form as well as the singular form unless otherwise specifically mentioned.

Figure 2:
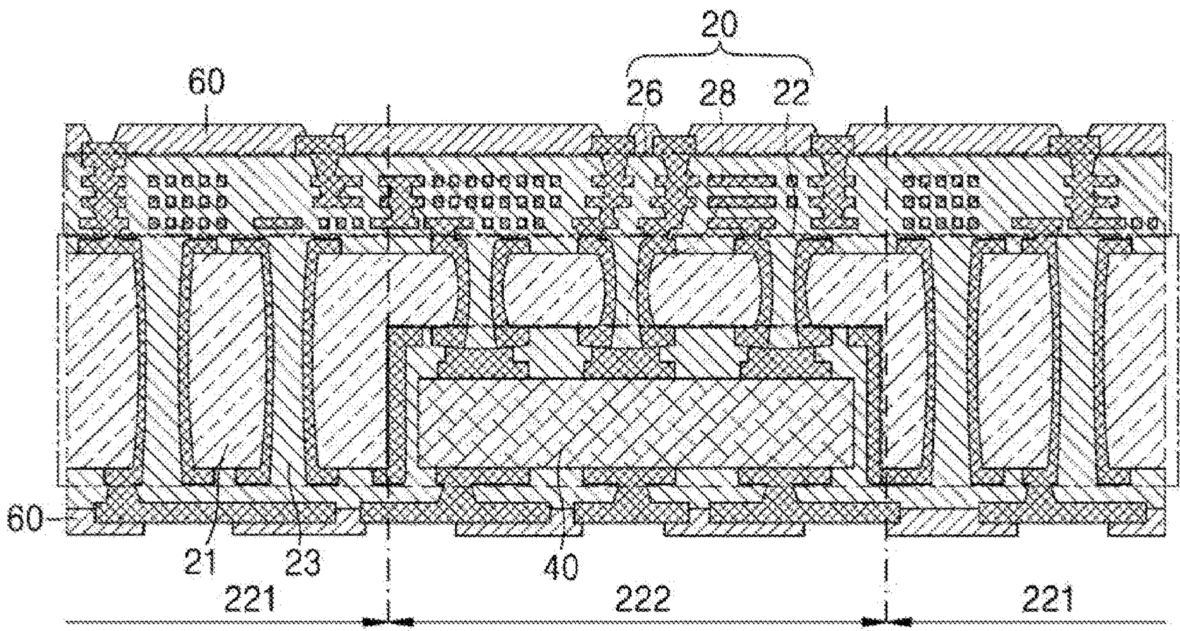
FIG. 2 is a conceptual diagram illustrating a cross-sectional structure of a packaging substrate according to another embodiment.
Figure 3:
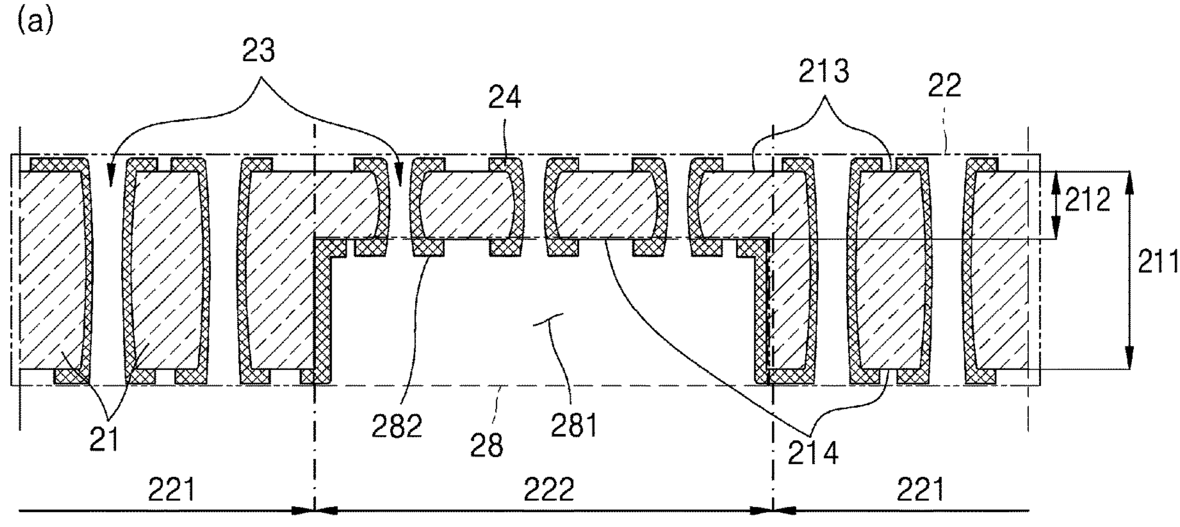
FIG. 3, (a) and (b) are conceptual views illustrating a portion of a packaging substrate according to an embodiment in cross section, respectively.
Figure 3:
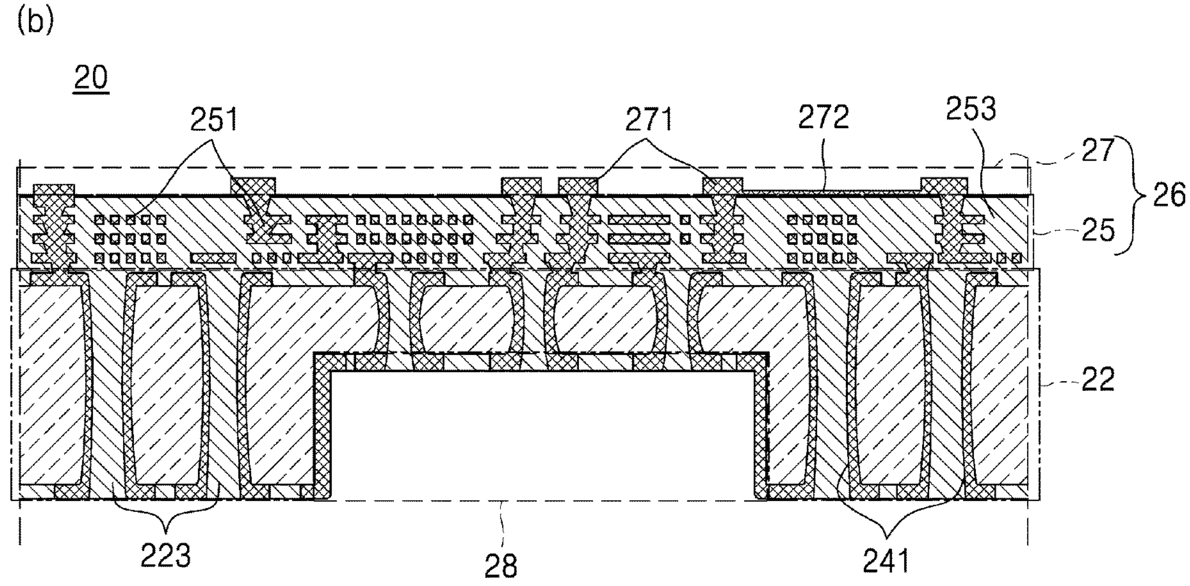

FIG. 1 is a conceptual diagram for describing a cross-sectional structure of a packaging substrate according to an embodiment, FIG. 2 shows a conceptual diagram for describing a cross-sectional structure of a packaging substrate according to another embodiment, and (a) and (b) of FIG. 3 are conceptual diagrams for describing portions of the packaging substrates according to the embodiments in cross-sections.

In order to achieve the above object, a semiconductor device 100 according to the embodiment comprises a semiconductor element portion 30 in which one or more semiconductor elements 32, 34, and 36 are located, a packaging substrate 20 electrically connected to the semiconductor elements, and a motherboard 10 that is electrically connected to the packaging substrate 20, transmits an external electrical signal to the semiconductor elements 32, 34, and 36, and connects the semiconductor elements 32, 34, and 36 to each other.

A packaging substrate 20 according to the embodiment comprises a core layer 22, an upper layer 26 located on one surface of the core layer 22, and a cavity portion 28 in which a cavity element 40 may be located.

The semiconductor element portion 30 refers to elements mounted in the semiconductor device and is mounted on the packaging substrate 20 by a connection electrode or the like. Specifically, as the semiconductor element portion 30, for example, arithmetic elements (a first element 32, a second element 34) such as a central processing unit (CPU), a graphics processing unit (GPU), and the like, a storage element (a third element 36) such as a memory chip, and the like may be applied, but any semiconductor element mounted in a semiconductor device may be applied without limitation.

A motherboard such as a printed circuit board, a printed wiring board, or the like may be applied as the motherboard 10.

The packaging substrate 20 may selectively further comprise a lower layer (not shown) located under the core layer.

The core layer 22 may comprise a glass core 21 comprising first regions 221 each having a first thickness 211 and a second region 222 adjacent to the first regions 221 and having a second thickness 212 thinner than the first thickness, a plurality of core vias 23 passing through the glass core 21 in a thickness direction, and a core distribution layer 24 that is located on a surface of the glass core 21 or the core via 23 and electrically connects a first surface 213 of the glass core 21 and a second surface 214 facing the first surface through the core vias 23.

The second region 222 of the core layer 22 may serve as a cavity structure.

In the same region, the glass core 21 has the first surface 213 and the second surface 214 facing each other, and these two surfaces are generally parallel to each other and have uniform thicknesses throughout the glass core 21.

An inner space 281 formed by a thickness difference between the first region 221 and the second region 222 serves to accommodate part or all the cavity element 40.

The glass core 21 may comprise the core vias 23 passing through the first surface 213 and the second surface 214. The core vias 23 may be formed in both the first region 221 and the second region 222 and may be formed with an intended pitch and pattern.

Conventionally, a form in which a silicon substrate and an organic substrate are stacked was applied as a packaging substrate for a semiconductor device. In the case of silicon substrates, there is a concern that parasitic elements are generated when applied to a high-speed circuit due to the nature of semiconductors, and a disadvantage in that power loss is relatively large. Further, in the case of organic substrates, a large area is required to form a more complicated distribution pattern, but this does not conform to the trend of manufacturing miniaturized electronic devices. In order to form a complicated distribution pattern within a predetermined size, pattern miniaturization is substantially required, but there is a practical limit to pattern miniaturization due to the nature of materials such as a polymer and the like applied to organic substrates.

In the embodiment, as a method of solving such problems, the glass core 21 is applied as a support of the core layer 22. Further, the packaging substrate 20 having a relatively shortened electrical flow, a relatively compact size, a faster response, and less loss characteristics is provided by applying the core vias 23 formed to pass through the glass core 21 along with the glass core 21.

As the glass core 21, a glass substrate applied to a semiconductor may be applied, and for example, a borosilicate glass substrate, an alkali-free glass substrate, or the like may be applied, but the present disclosure is not limited thereto.

The core vias 23 passes through the glass core 21. The core vias 23 may be formed in a method of removing predetermined regions of the glass core 21, and may be formed by physically and/or chemically etching plate-shaped glass.

Specifically, the formation of the core vias 23 may be performed by chemically etching or laser etching, or the like after forming defects (flaws) on the surface of the glass substrate using a method such as a laser, but the present disclosure is not limited thereto.

The number of core vias 23 located in the glass core 21 based on a unit area (1 cm×1 cm) may be 100 to 3,000, 100 to 2,500, or 225 to 1,024. When this pitch condition is satisfied, the formation of an electrically conductive layer and the like and the performance of the packaging substrate may be improved.

The core distribution layer 24 comprises a core distribution pattern 241, which is an electrically conductive layer electrically connecting the first surface and the second surface of the glass substrate through through-vias, and a core insulating layer 223, which covers the core distribution pattern 241. The core layer 22 may be formed with the electrically conductive layer therein through the core vias to serve as an electrical path crossing the glass core 21 and may connect upper and lower portions of the glass substrate with a relatively short distance to have characteristics of faster electrical signal transmission and low loss. For example, a copper-plated layer may be applied as the electrically conductive layers, but the present disclosure is not limited thereto.

The shape of the cavity portion 28 is substantially not limited to a shape such as a circular shape, a triangular shape, a quadrangular shape, a hexagonal shape, an octagonal shape, a cross shape, and the like.

The shape of the cavity element 40 may generally be a cylindrical shape, rectangular parallelepiped shape, or a polygonal pillar shape.

The cavity portion 28 may comprise a cavity distribution pattern, which is an electrically conductive layer electrically connecting the cavity element 40 and the core distribution layer 24, and an insulating layer, which covers the cavity distribution pattern.

Meanwhile, a cavity portion according to another embodiment may be implemented in the form of passing through the first surface 213 and the second surface 214 of the glass core 21. In this case, the cavity portion may be formed according to a similar process as a process of forming the core via 23, and the area and shape passing through the glass core 21 may be different from those of the core via 23.

In this embodiment, after the cavity element 40 is arranged in the cavity portion, an insulating layer may be formed. That is, the insulating layer may also be generated in the cavity portion through a process of generating the above-described core insulating layer 223.

The core distribution pattern 241 may be formed to be electrically connected to the cavity element 40.

The cavity element 40 may comprise an active element such as a transistor or a power transmission element such as a multilayer ceramic capacitor (MLCC), that is, a passive element.

When an element such as a transistor serving to convert an electrical signal between a motherboard and a semiconductor element portion to an appropriate level is applied as the cavity element 40, since a transistor or the like is applied to the path of the packaging substrate 20, a more efficient and faster semiconductor device 100 may be provided.

Further, a power transmission element such as a multilayer ceramic capacitor (MLCC) plays an important role in the performance of a semiconductor element. Generally, at least 200 or more power transmission elements, which are passive elements, are applied to a semiconductor element, and performance thereof is also affected by the characteristics of an electrically conductive layer around the element in power transmission. In one embodiment, a core via having a non-circular shape rather than a circular shape may be applied to a place, where a low-resistance electrically conductive layer is required, such as a power transmission element.

Meanwhile, a passive element, such as a capacitor or the like, may be individually inserted into and applied to the cavity element 40, and an element group including a plurality of passive elements in the form of being embedded between insulator layers (cavity element insulating layers) may be formed such that electrodes are exposed, and then inserted into the cavity element. In the latter case, the workability of manufacturing the packaging substrate may become smoother, and there is a relative advantage in that the insulating layer is sufficiently and reliably located in a space between complicated elements.

The glass core 21 serves as an intermediate and intermediary, which connect the semiconductor element portion 30 and the motherboard 10 at an upper portion and a lower portion, respectively, and the core vias 23 serve as paths through which the electrical signals thereof are transmitted, and thus smoothly transmit the signals.

The upper layer 26 is located on the first surface 213.

The upper layer 26 may comprise an upper distribution layer 25 and an upper surface connection layer 27 located on the upper distribution layer 25, and the uppermost surface of the upper layer 26 may be protected by a cover layer 60 formed with an opening that may come into direct contact with the connection electrode of the semiconductor element portion.

The upper distribution layer 25 may comprise an upper insulating layer 253 located on the first surface, and an upper distribution pattern 251 embedded in the upper insulating layer 253 as an electrically conductive layer having a predetermined pattern and to which the core distribution layer 24 is at least partially connected. The upper distribution pattern 251 may be connected to an upper or lower electrically conductive layer through a blind via 252.

Any one which is applied as an insulator layer in a semiconductor element, or a packaging substrate may be applied as the upper insulating layer 253, for example, an epoxy-based resin or the like including a filler may be applied, but the present disclosure is not limited thereto.

The insulator layer may be formed by a method of forming and curing a coating layer, and may also be formed by a method of laminating an insulator film formed to be a film in an uncured or semi-cured state on the core layer 22 and curing the insulator film. In this case, when a pressure sensitive lamination method or the like is applied, since insulator is incorporated into a space in the core via 23, and thus an efficient process may be performed.

According to one embodiment, even when multi-layer insulator layers are stacked and applied, it may become difficult to substantially distinguish the insulator layers, and a plurality of insulator layers are collectively called an upper insulation layer. Further, the same insulating material may be applied to the core insulating layer 223 and the upper insulating layer 253, and in this case, a boundary thereof may not be substantially distinguished. Alternatively, according to another embodiment, a boundary of the insulator layers may be generated by setting the pressure and temperature for curing the multi-layer insulator layers differently.

The upper distribution pattern 251 refers to an electrically conductive layer located in the upper insulating layer 253 in a preset form, and may be formed, for example, using a build-up layer method. Specifically, the upper distribution pattern 251 formed with an electrically conductive layer in a vertical direction or horizontal direction in an intended pattern may be formed by repeating a method of forming an insulator layer, removing unnecessary portions of the insulator layer, and then forming an electrically conductive layer by a method of copper plating or the like, selectively removing unnecessary portions of the electrically conductive layer, and then forming an insulator layer again on the electrically conductive layer, and removing unnecessary portions, and then forming an electrically conductive layer by a method of plating or the like.

The upper distribution pattern 251 is located between the core layer 22 and the semiconductor element portion 30, and thus is formed to comprise a micro pattern in at least a portion thereof so that transmission of the electrical signals with the semiconductor element portion 30 may be smoothly performed and an intended complicated pattern may be sufficiently accommodated. In this case, each of a width and an interval of the micro pattern may be smaller than 4 μm, 3.5 μm or less, 3 μm or less, and 2.5 μm or less, or may be 1 to 2.3 μm (hereinafter, descriptions for the micro pattern are the same).

At least a portion of the upper surface connection layer 27 is electrically connected to the upper distribution pattern 251, and the upper surface connection layer 27 comprises an upper surface connection pattern 272 located on the upper insulating layer 253 and an upper surface connection electrode 271, which electrically connects the semiconductor element portion 30 and the upper surface connection pattern 272.

The upper surface connection pattern 272 may be located on one surface of the upper insulating layer 253 and may be embedded in the upper insulating layer while at least a portion of the upper surface connection pattern 272 may be exposed on the upper insulating layer. For example, when the upper surface connection pattern is located on one surface of the upper insulating layer, the upper insulating layer may be formed by a method of plating or the like, and a case in which the upper surface connection pattern is embedded in the upper insulating layer while the portion of the upper surface connection pattern is exposed on the upper insulating layer, may be a case in which a portion of the insulating layer or electrically conductive layer is removed by a method such as surface polishing, surface etching, or the like after a copper-plated layer or the like is formed.

At least a portion of the upper surface connection pattern 272 may comprise a micro pattern like the above-described upper distribution pattern 251. The upper surface connection pattern 272 comprising the micro pattern allows a relatively larger number of elements to be connected even in a small area to make an electrical signal connection between the elements or with the outside smooth, and more integrated packaging is possible.

The upper surface connection electrode 271 may be directly connected to the semiconductor element portion 30 through a terminal or the like, and may also be connected to the semiconductor element portion 30 through an element connection portion 51 such as a solder ball.

The cavity portion 28 is located on and/or under the second region 222 and may comprise a cavity distribution layer 282 electrically connected to the core distribution pattern 241 and the inner space 281 in which the cavity element 40 is located.

Specifically, the thickness of the glass core 21 in the second region 222 is thinner than a thickness of the glass core 21 in the first region 221, and the cavity element 40 may be in the inner space 281 formed due to the thickness difference. Further, the core vias 23 and the core distribution layer 24 formed in the glass core 21 serve as an electrical connection structure connecting the cavity element 40 and external elements.

Further, as described above, in the second region 222 other than the first region 221, that is, a cavity portion in the form of passing through the first surface 213 and the second surface 214 of the glass core 21 may be generated, and the cavity element 40 may be arranged in the cavity portion.

The packaging substrate 20 is also connected to the motherboard 10. A terminal of the motherboard 10 may be directly connected to the core distribution pattern 241 located on at least a portion of the second surface 214 of the core layer 22, and the motherboard 10 may be electrically connected to the core distribution pattern 241 through a board connection portion 52 such as a solder ball. Further, the core distribution pattern 241, which encounters the motherboard 10, may be connected to the motherboard 10 through a lower layer (not shown) located under the core layer 22.

The connection portion 50 refers to a medium connecting the packaging substrate 20 to the mother board 10 and/or the semiconductor element portion 30, and connections such as solder balls of the same size or different sizes may be applied. The size of the solder ball disposed between the packaging substrate 20 and the mother board 10 may be equal to or larger than the size of the solder ball disposed between the packaging substrate 20 and the semiconductor element portion 30.

According to an example, other additional substrates other than the glass core 21 may not be substantially applied to the packaging substrate 20 located between the semiconductor element portion 30 and the motherboard 10.

Conventionally, an interposer and an organic substrate were stacked together and applied between the element and the motherboard while connecting the element and the motherboard because a multi-stage form is applied for at least two reasons: one is that there is a scale problem in directly bonding a micro pattern of the element to the motherboard; and the other is that a problem of wiring damage due to a difference in thermal expansion coefficient may occur during a bonding process or a process of driving the semiconductor device.

In the embodiment, this problem was solved by applying a glass substrate having a thermal expansion coefficient similar to that of a semiconductor element and forming a micro pattern having a sufficiently fine scale for mounting the element on the first surface and an upper layer of the glass substrate.

Hereinafter, a packaging substrate manufacturing method according to the embodiment of the present disclosure will be described.

Figure 4:
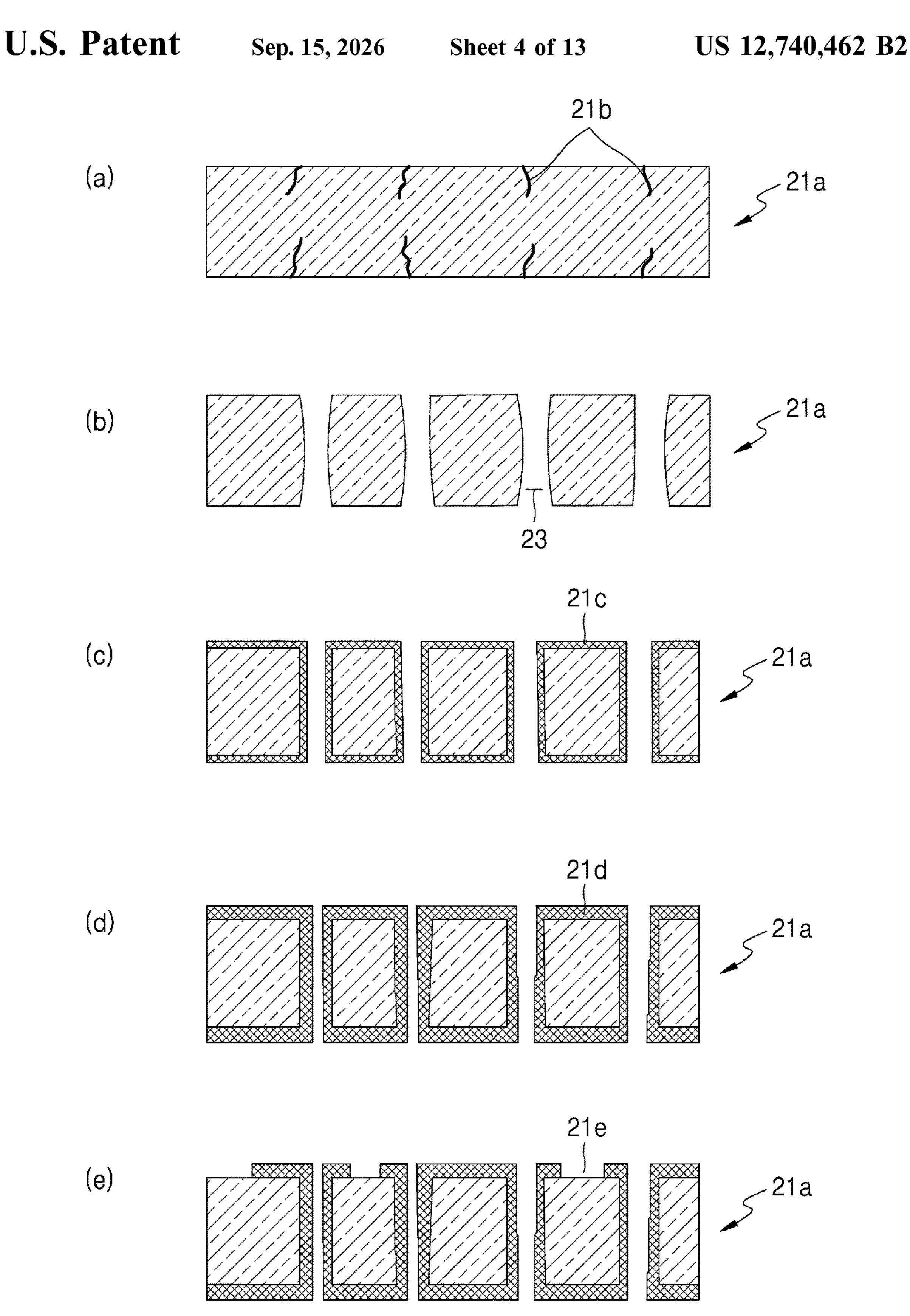
FIG. 4 is a flowchart illustrating a process of generating a core distribution layer in a process of manufacturing a packaging substrate according to an embodiment in cross section.
Figure 5:
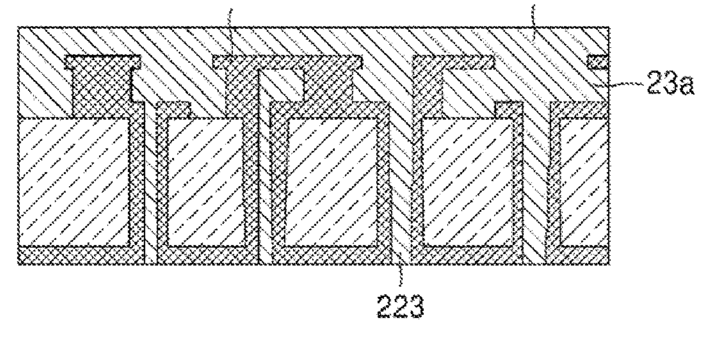
FIG. 5 is a flowchart illustrating a process of generating an insulating layer in a process of manufacturing a packaging substrate according to an embodiment in cross section.

FIGS. 4 and 5 are flow charts for describing the packaging substrate manufacturing process according to the embodiment in cross-sections.

First, as shown in (a) of FIG. 4, a glass core 21*a* having flat first and second surfaces is prepared, and defects (flaw, 21*b*) are formed at predetermined positions in a glass surface to form core vias. A glass substrate applied to a substrate of an electronic device, or the like may be applied as the glass substrate, for example, an alkali-free glass substrate may be applied as the glass substrate, but the present disclosure is not limited thereto. As commercially available products, products manufactured by manufacturers such as Corning, Schott, AGC, and the like may be applied. A method such as mechanical etching, laser irradiation, or the like may be applied to the formation of the defects (flaw).

As shown in (b) of FIG. 4, in the glass core 21*a* having the defects (flaw) 21*b*, an etching operation of forming the core vias 23 through a physical or chemical etching process is performed. During the etching process, the vias are formed in defective portions of the glass substrate, and the surface of the glass core 21*a* may also be etched.

In order to prevent etching of the glass surface, a masking film or the like may be applied, but considering the inconvenience of applying and removing the masking film, the defective glass substrate itself may be etched, and in this case, the thickness of the glass substrate having the core vias may be somewhat thinner than the initial thickness of the glass substrate.

Thereafter, as shown in (c) and (d) of FIG. 4, a core layer manufacturing operation may be performed by forming an electrically conductive layer 21*d* on the glass substrate. A metal layer comprising copper metal may be representatively applied as the electrically conductive layer, but the present disclosure is not limited thereto.

Since the surface of the glass (comprising the surface of the glass substrate and a surface of the core via) and the surface of the copper metal have different properties, adhesion may be low. In the embodiment, the adhesion between the glass surface and the metal may be improved by two methods such as a dry method and a wet method.

The dry method is a method of applying sputtering, that is, a method of forming a seed layer 21*c* on the glass surface and an inner diameter of the core via through metal sputtering. Dissimilar metals such as titanium, chromium, and nickel may be sputtered together with copper to form the seed layer, and in this case, glass-metal adhesion may be improved by an anchor effect, in which metal particles interact with the surface morphology of the glass, or the like.

The wet method is a method of performing primer treatment, and is a method of forming a primer layer 21*c* by performing pre-treatment with a compound having a functional group such as an amine. The primer treatment may be performed with a compound or particles having an amine functional group after performing pre-treatment with a silane coupling agent according to the degree of intended adhesion. As mentioned above, a support substrate of the embodiment needs to have high enough performance to form a micro pattern, and this should be maintained even after primer treatment. Accordingly, when such a primer includes nanoparticles, nanoparticles having an average diameter of 150 nm or less may be applied, for example, nanoparticles having an amine group may be applied. The primer layer may be, for example, formed by applying a bonding strength improving agent, e.g., the CZ series manufactured by MEC or the like.

In the seed layer/primer layer 21*c*, the electrically conductive layer may selectively form the metal layer in a state in which unnecessary portions for the formation of the electrically conductive layer are removed or not removed. Further, in the seed layer/primer layer 21*c*, portions required or not required for the formation of the electrically conductive layer in an activated or deactivated state may be treated selectively with metal plating to perform subsequent processes. For example, light irradiation treatment such as a laser of a certain wavelength or the like, chemical treatment, or the like may be applied to the activation or deactivation treatment. A copper plating method or the like applied to semiconductor element manufacturing may be applied to the formation of the metal layer, but the present disclosure is not limited thereto.

As shown in (e) of FIG. 4, a portion of the core distribution layer may be removed when unnecessary, and after a portion of the seed layer is removed or deactivated, metal plating may be performed to form an electrically conductive layer in a predetermined pattern, and then an etching layer 21*e* of the core distribution layer is formed.

FIG. 5 describes a manufacturing operation of forming an insulating layer and an upper distribution pattern according to one embodiment.

As shown in (a) of FIG. 5, the core via may go through an insulating layer forming operation of filling an empty space with an insulating layer after forming a core distribution layer, which is the electrically conductive layer. In this case, an insulating layer manufactured in the form of a film may be applied as the insulating layer to be applied, and for example, a pressure sensitive lamination method of the insulating layer in the form of a film, or the like may be applied. When the pressure sensitive lamination is performed in this way, the insulating layer is sufficiently incorporated into the empty space in the core via to form a core insulating layer in which a void is not formed.

(b) to (e) of FIG. 5 describe an upper layer manufacturing operation.

The upper layer manufacturing operation is an operation of forming an upper distribution layer comprising an upper insulating layer and an upper distribution pattern on the core layer. The upper insulating layer may be formed by a method of coating a resin composition forming an insulating layer 23*a* or laminating insulating films, and for convenience, the method of laminating the insulating films is better. The laminating of the insulating films may be performed by a process of laminating and curing the insulating films, and in this case, when a pressure sensitive lamination method is applied, an insulating resin may be sufficiently incorporated even into a layer in which the electrically conductive layer is not formed in the core via or the like. An upper insulating layer which comes into direct contact with at least a portion of the glass substrate, and thus has sufficient adhesion is applied as the upper insulating layer. Specifically, the glass substrate and the upper insulating layer may have characteristics in which adhesion test values according to ASTM D3359 satisfy 4B or more.

The upper distribution pattern may be formed by repeating the process of forming an insulating layer 23*a*, and forming an electrically conductive layer 23*c* in a predetermined pattern and etching unnecessary portions to form an etching layer 23*d* of the electrically conductive layer, and electrically conductive layers formed adjacent to each other with the insulating layer therebetween may be formed by a method of performing a plating process after forming a blind via 23*b* in the insulating layer. A dry etching method such as laser etching, plasma etching, or the like, a wet etching method using a masking layer and an etchant, or the like may be applied to the formation of the blind via.

Hereinafter, although not shown in the drawings, an upper surface connection layer and a cover layer may be formed.

The upper surface connection pattern and the upper surface connection electrode may also be formed in a process similar to forming the upper distribution layer. Specifically, the upper surface connection pattern and the upper surface connection electrode may be formed by a method of forming an etching layer of the insulating layer on an insulating layer 23*e*, forming an electrically conductive layer thereon, and then forming an etching layer of the electrically conductive layer, or the like, but a method of selectively forming only the electrically conductive layer without applying an etching method may also be applied. The cover layer may be formed so that an opening (not shown) may be formed at a position corresponding to the upper surface connection electrode and thus the upper surface connection electrode is exposed, and the cover layer may be directly connected to an element connection portion, a terminal of an element, or the like.

When the upper layer is generated, a process for the lower layer may be performed by forming a lower connection layer and the cover layer. A lower distribution layer and/or the lower connection layer, and selectively, the cover layer (not shown) may be formed in a manner similar to the above-described operation of forming the upper surface connection layer and cover layer.

On the other hand, as described above, the core layer may include a glass core and a cavity portion, and the glass core is a glass substrate with a first surface and a second surface facing each other, and the cavity portion may have an accommodation space for receiving at least an electronic element as part of the glass core is embedded or penetrated.

An electronic element may be arranged in the accommodation space of the cavity portion. In addition, when multiple electronic elements are embedded, especially when multiple electronic elements are arranged and embedded in adjacent locations, separation between elements is required to prevent short circuits. As a result, the empty space in the cavity portion that needs to be filled with a film-type insulating layer increases, and it may be difficult to maintain the flatness of the upper surface of the insulating layer over the entire substrate area. The insulating layer may include an inorganic particle such as an azinomoto build-up film (ABF) and a polymer resin.

Accordingly, an element package (element molding package) with multiple electronic elements embedded therein may be manufactured, and a method of manufacturing a device embedded substrate by placing the element package in the accommodation space of the cavity portion may be used. Here, the element molding package which prepared with molded elements is referred to as an element package.

Here, the element package may be manufactured by a transfer molding process using a transfer mold.

Figure 6:
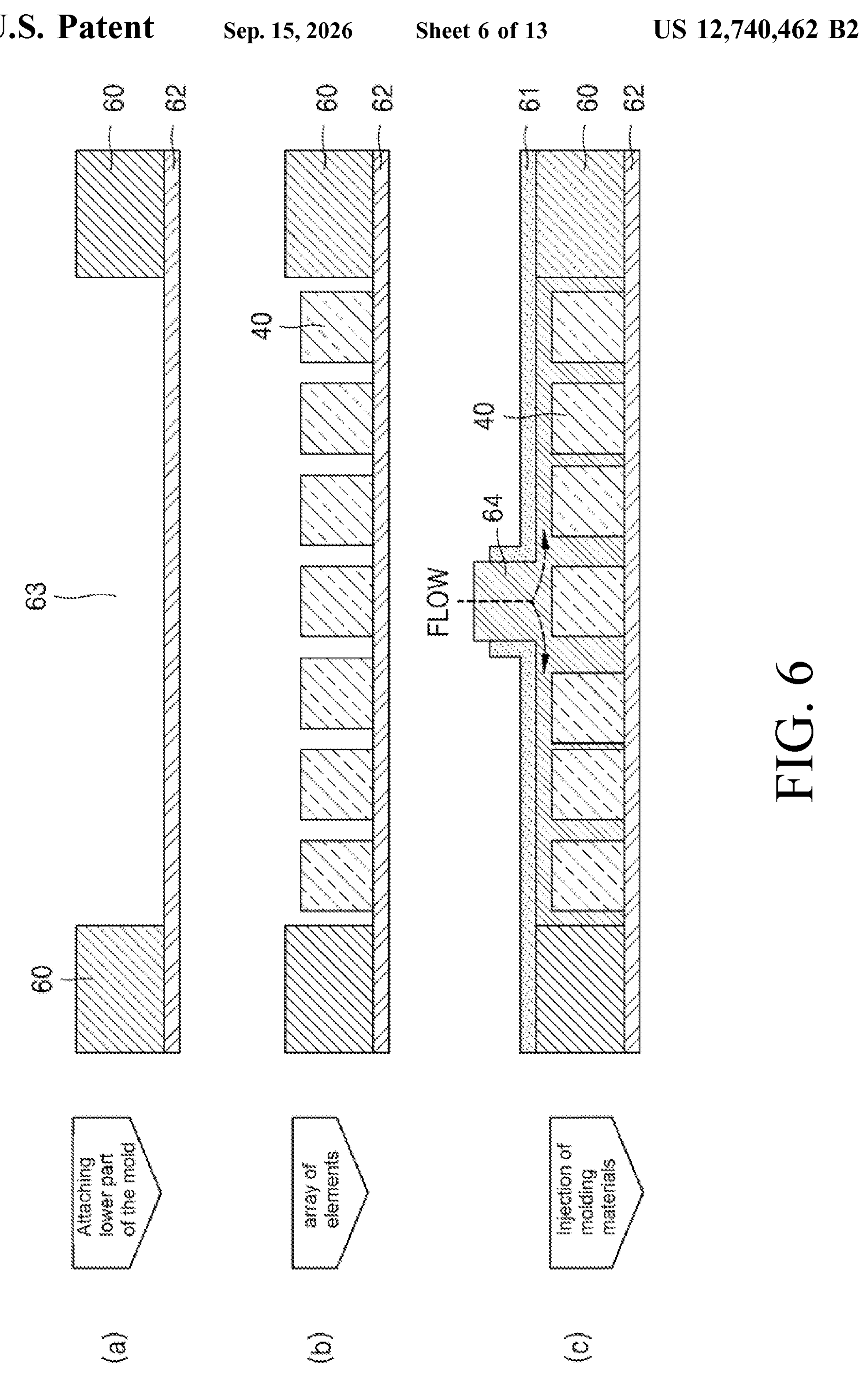
FIG. 6 is a flowchart illustrating a process of generating an element package by a conventional transfer molding process in a cross section.

FIG. 6 is a flowchart illustrating a process of generating an element package by a transfer molding process in a cross section.

For example, according to a transfer molding process, multiple electronic elements can be placed in the mold cavity of the transfer mold, and molding materials can be poured into the mold cavity and cured to create an element package with multiple electronic elements embedded.

For example, referring to (a) of FIG. 6, the lower part of the mold 62 may be placed on the bottom surface of the transfer mold 60 where the mold cavity 63 is formed. Polyimide Tape (PI tape) or the like may be applied to the lower part of the mold 62 but is not limited thereto.

Next, referring to (b) of FIG. 6, electronic elements 40 may be arranged in the mold cavity 63 of the transfer mold 60, and as shown in (c) of FIG. 6, the upper part of the mold 61 may be covered on the upper surface of the transfer mold 60, and the molding material 64 may be flowed through the gate of the upper part of the mold 61 and cured to create an element package.

The element package may include a plurality of electronic elements and a molding portion.

A plurality of electronic elements may be arranged in a predetermined form.

The molding portion may be disposed/cured so that the molding material maintains and surrounds the arrangement of the electronic elements.

The molding material may be a mixture of a polymer resin, a polymer resin, and a filler (inorganic particles, organic particles, organic/inorganic composite particles, etc.).

For example, acrylic resins, epoxy resins, modified resins thereof, and the like may be applied to the polymer resin, and materials applicable to electronic elements for purposes such as molding may be applied. For example, a liquid crystal polymer (LCP) or the like may be applied.

For example, the above mixture material may be a mixture of acrylic resin and filler, a mixture of acrylic resin and epoxy resin and filler, a mixture of epoxy resin and filler, and the like. Inorganic particles may be applied to the filler, and silica particles may be applied as an example. As commercial products, ABF (Ajinomoto Build-up Film, ABF), Epoxy Molding Compound (EMC), and Modified Polyimide (MPI) can be applied, but are not limited thereto.

Specifically, the molding material may include EMC (Epoxy Molding Compound), LCP (liquid crystal polymer, LCP), and/or ABF (Ajinomoto Build-up Film, ABF).

In the transfer molding process of generating the element package, there may be a problem that the lower part of the mold (e.g., PI tape) may not fix the position of the individual element sufficiently in the process of injecting the molding material, since lower part of the mold does not have insufficient adhesion, or does not maintain with fast injection process, etc.) It may cause some elements to deviate from its original position.

Since contact between the elements may occur due to a phenomenon in which the element deviates from its original position, the present specification proposes embodiments capable of preventing movement of the element in the process of generating an element package.

For example, an embodiment of generating an element package in which multiple electronic elements are embedded may be proposed by a transfer molding process using a transfer mold with a protrusion portion formed on the upper part of the mold.

Figure 7:
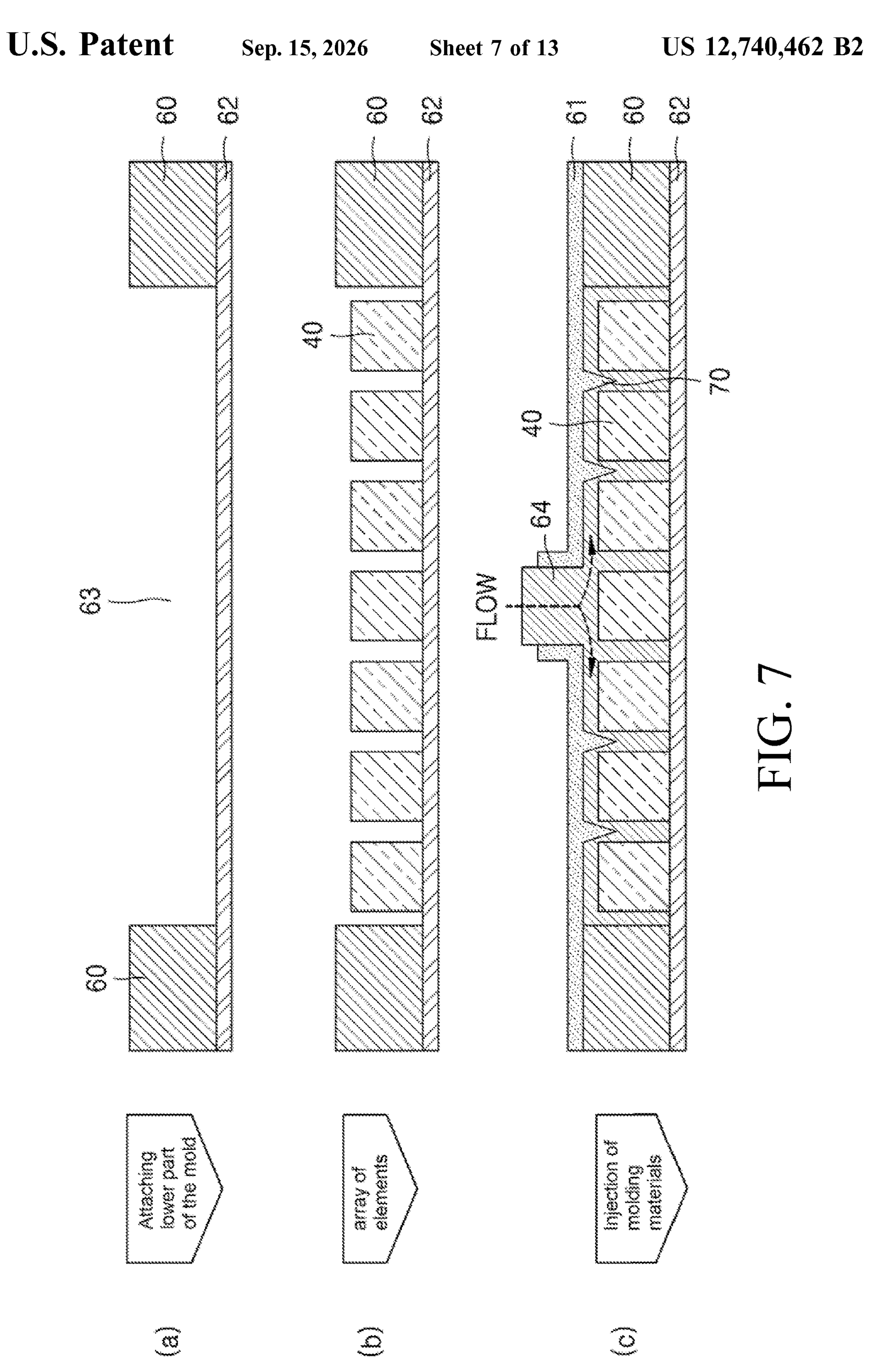
FIG. 7 is a flowchart illustrating a process of generating an element package by a transfer molding process according to an embodiment in cross section.

FIG. 7 is a flowchart illustrating a process of generating an element package by a transfer molding process according to an embodiment in cross section.

A manufacturing method of an element package according to an example of the present specification is as follows.

For example, an element package can be manufactured, including preparing a mold with an inlet, placing electronic elements at a predetermined location in the mold, injecting molding materials into the inlet, and forming a mold to form a molding portion by curing the molding material to form a molding portion.

Here, the mold may have a protrusion portion having arranged protrusions disposed around the inlet, and the concave portion of the element package and the protrusion portion may be positioned.

Specifically, referring to (a) of FIG. 7, the lower part of the mold 62 may be attached to the bottom surface of the transfer mold 60 where the mold cavity 63 is formed. Polyimide tape (PI tape) may be disposed on a part or the whole of the lower part 62 of the mold.

Next, referring to (b) of FIG. 7, electronic elements may be arranged in the mold cavity 63 of the transfer mold 60, and as shown in (c) of FIG. 7, the upper part of the mold 61 may be covered on the upper surface of the transfer mold 60, molding materials may flow through the gate of the upper part of the mold 61 and be cured to form a molding portion, and an element package may be generated. The gate means an inlet for injecting molding materials or the like.

For example, a protrusion portion 70 having arranged protrusions may be formed inwardly on the upper part 61 of the mold.

When the molding material flows due to the protrusion portion 70 formed on the upper part of the mold 61, it is possible to alleviate the force applied to the elements by the flow of the molding material, and to substantially prevent the elements from deviating from their original position.

For example, the protrusions formed on the upper part of the above mold 61 may be located between electronic elements when viewed from the cross section of the transfer mold 60. That is, for example, the protrusions formed on the mold upper portion 61 may be disposed between adjacent electronic devices.

Since the description of the molding material overlaps with the above description, a detailed description thereof will be omitted.

Meanwhile, the position of the protrusions disposed on the mold illustrated in FIG. 7 is, for example, not limited thereto.

For example, the mold may have protrusions disposed around the inlet.

As illustrated in FIG. 7, a protrusion portion 70 may be formed on the upper part 61 of the mold. Alternatively, for example, a protrusion portion 70 may be formed on the lower portion 62 of the mold. Alternatively, for example, a protrusion portion 70 may be formed on the mold upper portion 61 and the mold lower portion 62. The protrusion portion may help to maintain substantially the same position where the electronic elements are disposed in the element arrangement operation and the position where the electronic elements are disposed in the mold formation operation.

Figure 8A:
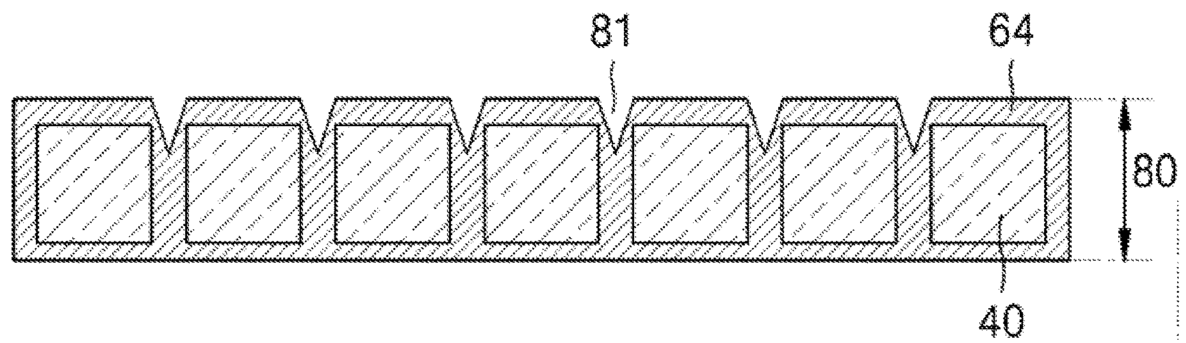
FIGS. 8A to 8C are conceptual diagrams for explaining an element package generated by a transfer molding process using a transfer mold in which a protrusion portion is formed in accordance with an example, respectively.
Figure 8B:
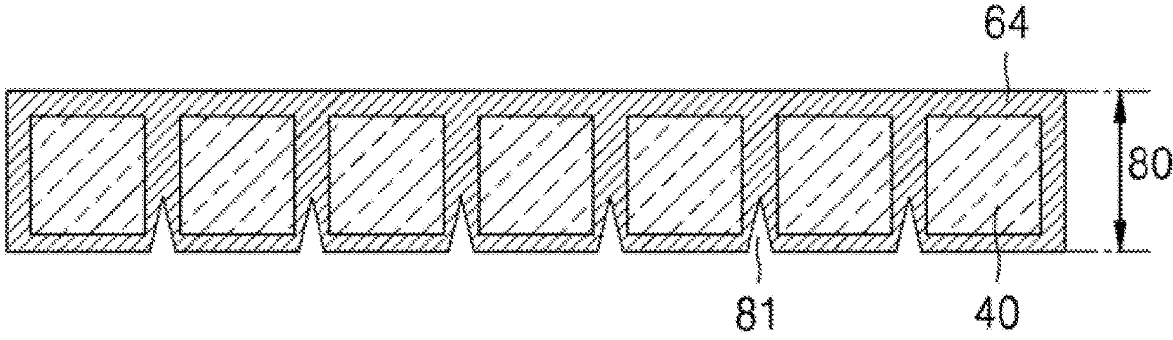
Figure 8C:
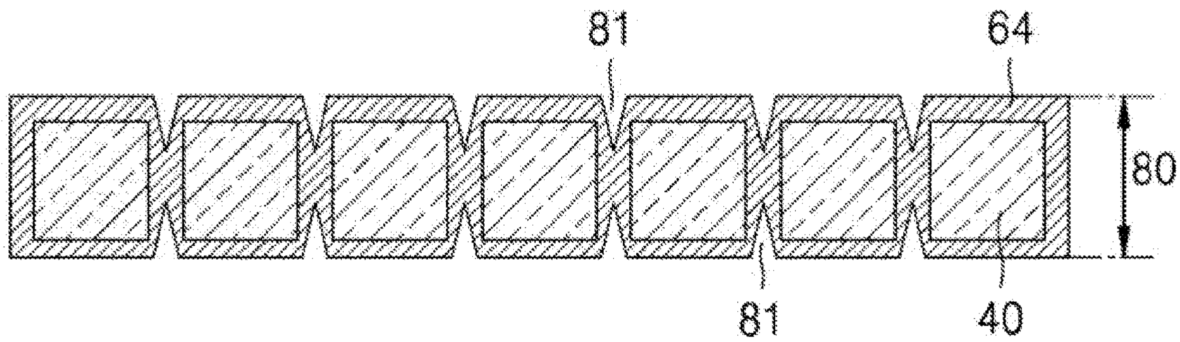

FIGS. 8A to 8C are conceptual diagrams for explaining an element package generated by a transfer molding process using a transfer mold in which a protrusion portion is formed in accordance with an example, respectively.

For example, referring to FIGS. 8A to 8C, the element package 80 may include a plurality of arranged electronic elements 40 and a molding portion 64 in which the molding material is disposed to surround the electronic elements.

For example, as described above, a mixture of a polymer resin, a polymer resin, and a filler (inorganic particles, organic particles, organic/inorganic composite particles, etc.) may be used as the molding material surrounding the plurality of electronic elements.

In addition, a concave portion having arranged dimples may be disposed in some of the molding materials of the molding portion in the element package. The positions of the concave portion and the protrusion portion may correspond to each other.

For example, referring to FIG. 8A, a concave portion having arranged dimples may be disposed on an upper surface of the molding portion of the element package 80.

Alternatively, referring to FIG. 8B, for example, a concave portion having arranged dimples may be disposed on the bottom surface of the molding portion of the element package 80.

Alternatively, for example, referring to FIG. 8C, concave portions having arranged dimples may be disposed on the upper and bottom surfaces of the molding portion of the element package 80.

For example, the protrusion portion 70 formed on the upper part of the mold 61 may form a concave portion 81 on the upper surface of the molding part of the device package 80.

Alternatively, for example, a concave portion 81 may be formed on the bottom surface of the molding portion of the device package 80 due to the protrusion portion 70 formed in the lower part of the mold 62.

Alternatively, for example, concave portions 81 may be formed on the upper and bottom surfaces of the molding portion of the element package 80 due to the protrusion portions 70 formed in the upper mold portion 61 and the lower mold portion 62.

The dimples may be disposed between the electronic elements 40 adjacent to each other in the element package 80. For example, the dimples may be disposed between the first electronic element and the second electronic element adjacent to each other in the device package 80.

The concave portion 81 may have various shapes according to the shape of the protrusion portion 70. For example, the shape of the cavity portion of the glass core can have various shapes such as crosses, T-shapes, and rectangles, and the shape of the cavity of the transfer mold 60 can be similarly changed. The overall shape of the concave portion 81 or the protrusion portion 70 may have various shapes in consideration of the shape of the cavity portion.

In addition, the shape of the protrusion portion 70 formed in the above mold may have various shapes. For example, the shape of the protrusion portion 70 formed in the above mold may have a broken structure in between so as not to interfere with the flow of the molding material when the molding material is injected.

Figure 9A:
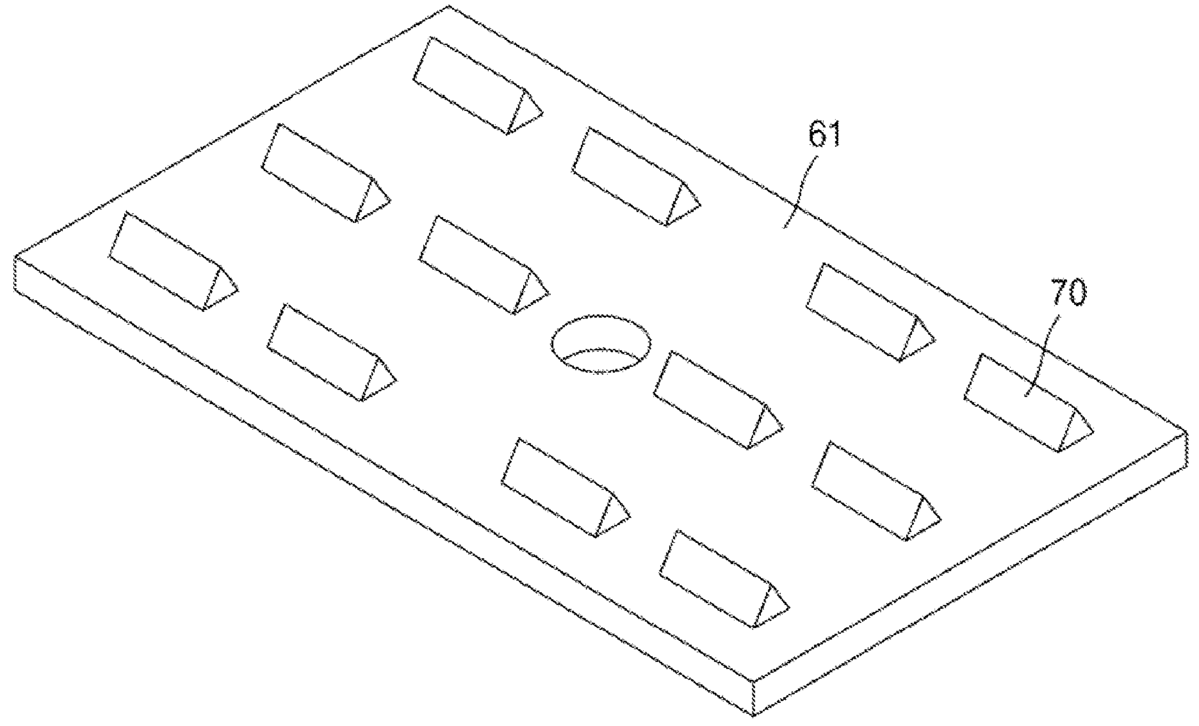
FIGS. 9A and 9B are conceptual diagrams respectively explaining a transfer mold having a protrusion portion formed according to an embodiment and a partial surface of an element package generated by the transfer mold.
Figure 9B:
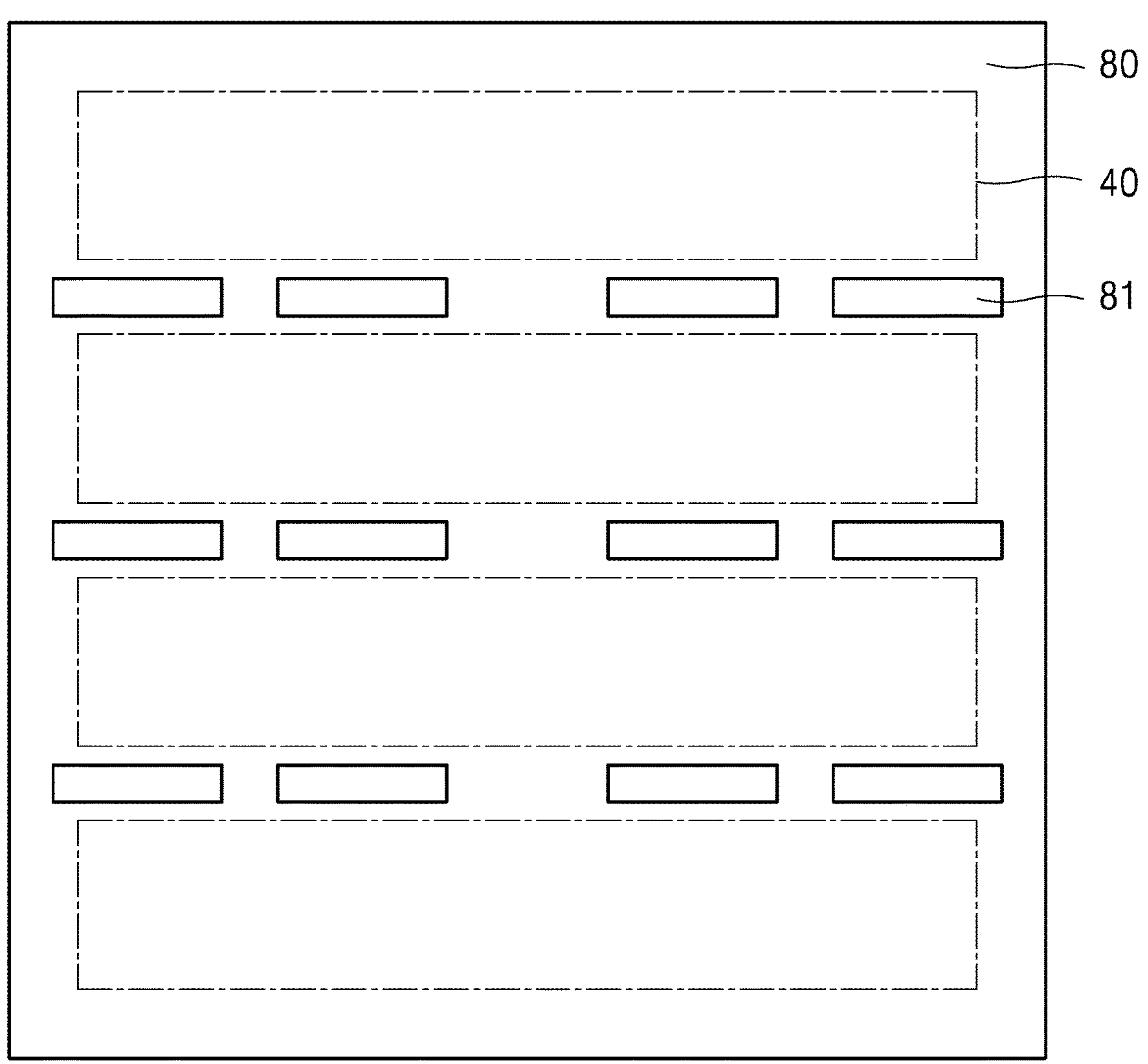

FIGS. 9A to 9B are conceptual views illustrating a transfer mold having a protrusion portion formed according to an embodiment and a partial surface of an element package generated by the transfer mold.

For example, a mold having an inlet may be provided, and the mold may have protrusions disposed around the inlet (gate). For example, a protrusion portion having arranged protrusions may be disposed above the mold. Alternatively, for example, a protrusion portion having arranged protrusions may be disposed under the mold. Alternatively, for example, protrusion portions may be disposed above and below the mold. The position of the protrusion portion and the position of the protrusions disposed on the mold are not limited thereto as an example.

For example, referring to FIG. 9A, protrusion portions 70 may be disposed in the upper part 61 and/or the lower part 62 of the mold. For example, the protrusions formed on the upper part of the mold 61 and/or the lower part of the mold 62 may be in the form of a triangular column with a triangular cross section. The protrusions may be formed in a form in which one surface, which is a square of a triangular column, is in contact with the upper mold 61 and/or the lower mold 62.

Protrusions formed on the upper part of the mold 61 and/or the lower part of the mold 62 may be placed between adjacent electronic elements of the element package 80. For example, the protrusions formed on the upper part of the above mold 61 may be placed between the first and second electronic elements adjacent to each other in the element package 80. The embodiments shown in the drawings are merely illustrative, and various modifications and improved forms of those skilled in the art using the basic concepts of embodiments are possible.

In addition, FIG. 9B exemplarily shows some aspects of the element device package 80 created by the transfer mold 60 in which the protrusion portion 70 having arranged dimples is formed in FIG. 9A.

For example, referring to FIG. 9A, concave portions 81 having arranged dimples may be formed on the upper surface and/or the bottom surface of the molding portion of the element package 80.

For example, referring to FIG. 9B, concave portions 81 having arranged dimples may be formed in some of the molding materials of the molding part of the element package 80 due to protrusion portions 70 having arranged protrusions and formed in a part of the mold. For example, the concave portion and the protrusion portion may have positions corresponding to each other. The dimples and the protrusions may have positions corresponding to each other.

For example, the aspect ratio of the dimple may be an aspect ratio of a recessed port that is an opening of the dimple. When the dimple is viewed from above, the aspect ratio may be a ratio of a major axis to a minor axis of the dimple inlet (opening).

For example, when the inlet of the dimple is rectangular, the aspect ratio may be a horizontal and vertical ratio. For example, when the inlet of the dimple is elliptical, the aspect ratio may be a ratio of a major axis to a minor axis. For example, when the inlet of the dimple is triangular, the aspect ratio may be a ratio between the bottom side and the height.

The aspect ratio of the dimple may be 1 to 12 or may be 1.5 to 8.

In the shape of the protrusions formed in the mold proposed by the present specification, a protrusion may be disposed as a small dotted line shape so as to substantially suppress movement of the position of the element and maximize the flow of the molding material.

The dotted line means that a plurality of protrusions is disposed at intervals in a space in which the cavity is mounted. In this case, the protrusion portion 70 may be formed by arranging individual protrusions adjacent to each other at intervals. The interval may be constant or irregular. That is, the size of the protrusion and/or the arrangement between the protrusions may be regular or irregular. In the dotted line shape, all or at least a part of the protrusion may be disposed between the electronic elements in a space in which the electronic devices are disposed.

Figure 10A:
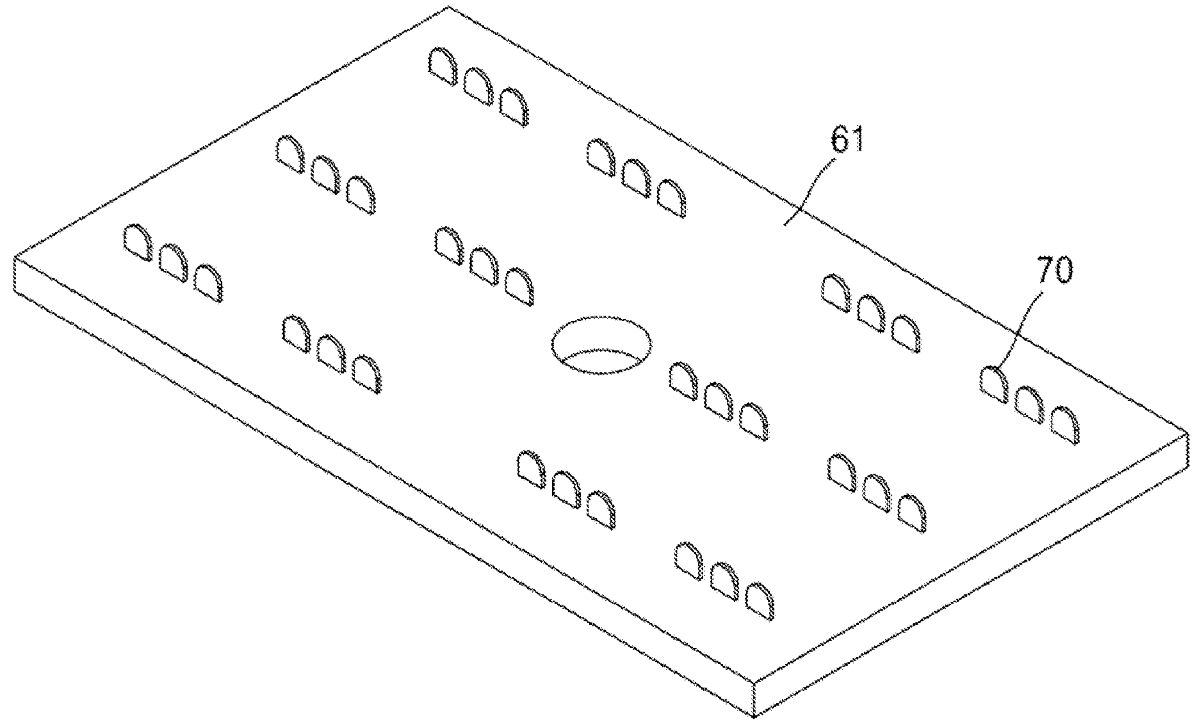
FIGS. 10A and 10B are conceptual diagrams respectively explaining a transfer mold with a protrusion portion formed according to an embodiment and a part of the element package generated by the transfer mold.
Figure 10B:
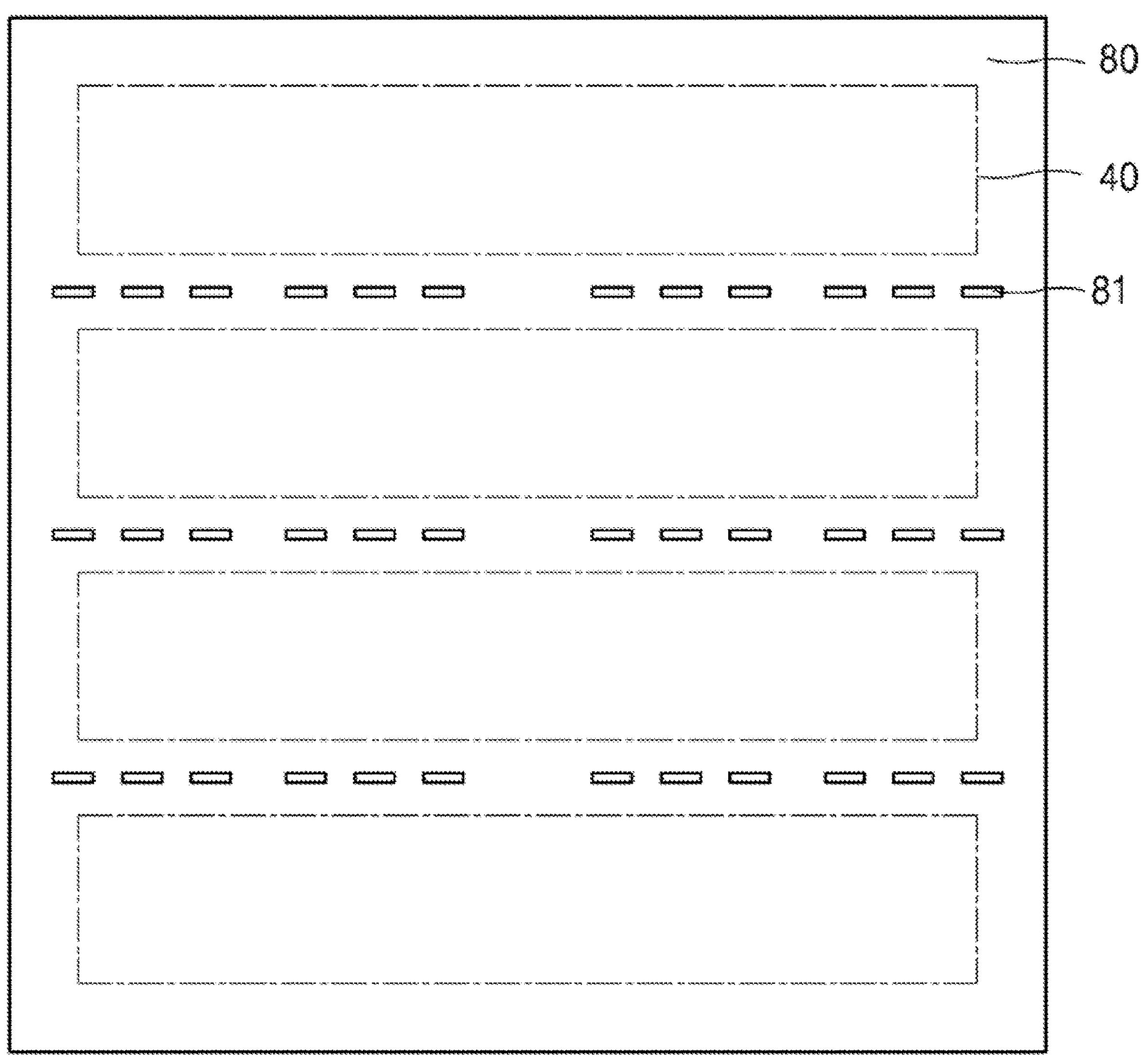

FIGS. 10A to 10B are conceptual views illustrating a transfer mold having a protrusion portion formed according to an embodiment and a partial surface of an element package generated by the transfer mold.

Referring to FIG. 10A, protrusion portions 70 may be disposed on the mold upper part 61 and/or the mold lower part 62.

For example, protrusions spaced apart at regular intervals may be disposed on the upper mold 61 and/or the lower mold 62. A certain number of protrusions disposed in the upper mold 61 and/or the lower mold 62 may be placed between adjacent electronic element of the element package 80.

For example, the protrusion portion may have a dotted line shape. Since the description of the dotted line overlaps with that described above, a detailed description thereof will be omitted.

For example, a certain number of protrusions formed in the upper part of the mold 61 and/or the lower part of the mold 62 may be placed between the first and second electronic elements adjacent to each other in the element package 80. The embodiments shown in the drawings are merely illustrative, and various modifications and improved forms of those skilled in the art using the basic concepts of embodiments are possible.

FIG. 10B exemplarily shows some aspects of the element package 80 created by the transfer mold 60 in which the protrusion portion 70 shown in FIG. 10A is formed.

For example, concave portions 81 having arranged dimples may be formed on an upper surface and/or a bottom surface of the molding portion of the element package 80. For example, referring to FIG. 10A, concave parts 81 having arranged dimples may be formed in some of the molding parts of the element package 80 due to protrusions formed in a part of the mold. For example, the concave portion and the protrusion portion may have positions corresponding to each other. The dimples and the protrusions may have positions corresponding to each other.

Referring to FIG. 10B, a plurality of dimples may be arranged in a dotted line shape in a direction from a first surface (for example, an upper surface of the element package) to a second surface (for example, a bottom surface of the element package).

The dotted line means that a plurality of dimples is disposed at intervals in a space in which the cavity is mounted. In this case, the concave portion 81 may be individual dimples adjacent to each other arranged at intervals. The interval may be constant or irregular. That is, the size of the dimple and/or the arrangement in the dimples may be regular or irregular. In the dotted line shape, all or at least a part of the concave portion or of the dimples may be disposed between the electronic elements in a space in which the electronic elements are disposed.

On the other hand, it is not limited to the above embodiments of the protrusion portion formed on the upper part of the mold and the concave portion formed on the molding part of the element package proposed in this specification. For example, various types of protrusions and concave shapes can be applied in consideration of the shape of the cavity portion in which the element package is placed.

In addition, this specification proposes a manufacturing method for generating a packaging substrate according to an embodiment.

The manufacturing method of producing a packaging substrate according to the embodiment of this specification may include preparing a glass core and an element package with a cavity portion, placing the element package in the cavity portion, and forming an insulating layer by placing and curing an insulating material on the glass core or the cavity portion.

Figure 11:
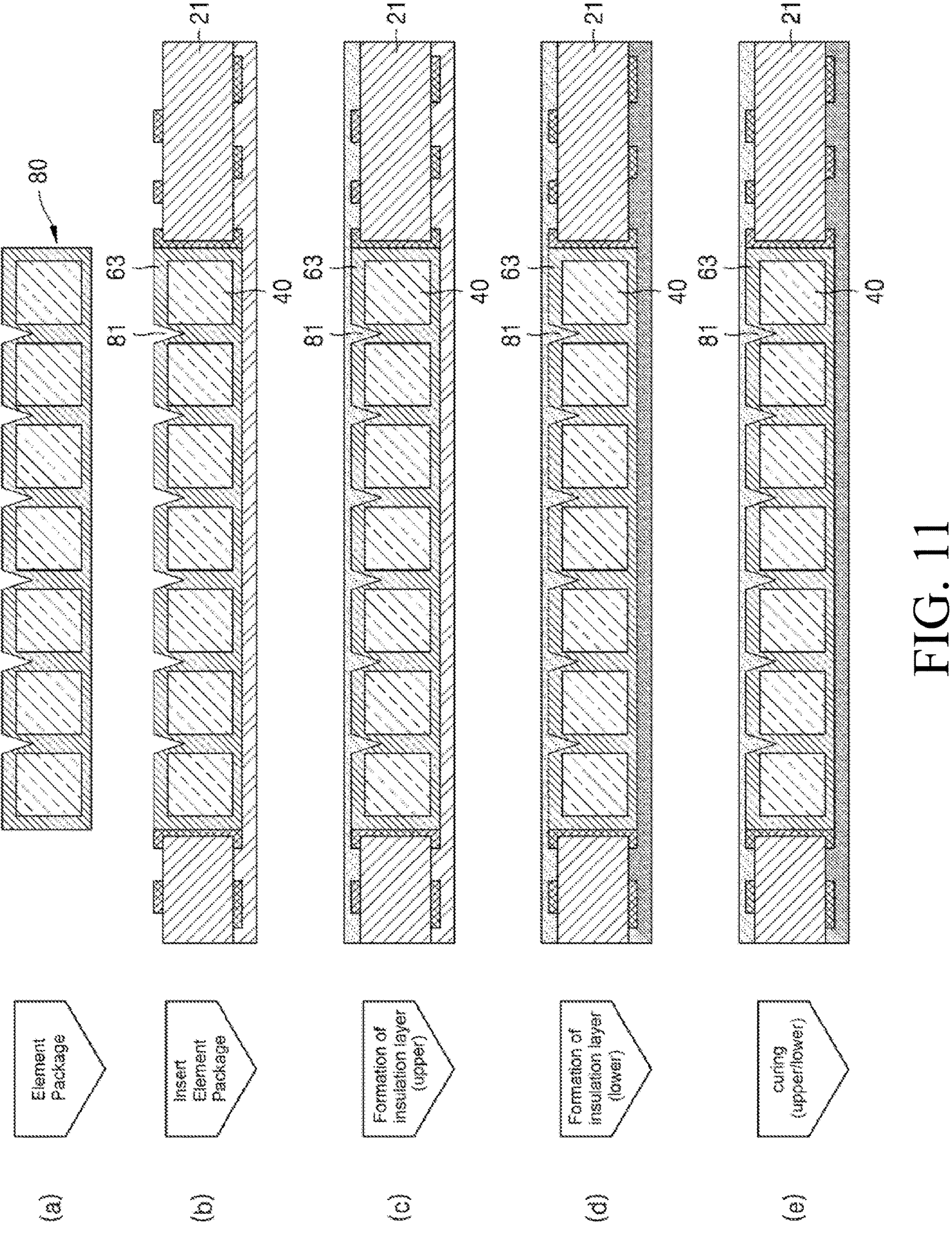
FIG. 11 is a flowchart illustrating a method of manufacturing a packaging substrate according to an embodiment in a cross section.

FIG. 11 is a flowchart illustrating a method of manufacturing a packaging substrate according to an embodiment in a cross section.

Referring to (a) of FIG. 11, a glass core and an element package 80 in which a cavity portion is disposed may be provided.

For example, the packaging substrate may include a core layer that includes a glass core with a first surface and a second surface facing each other and a cavity portion recessed or penetrating the glass core. A glass core having a first surface and a second surface facing each other may be provided, and a cavity portion penetrating the glass core may be disposed in the glass core.

In addition, for example, the element package 80 can be created by a transfer molding process using a transfer mold 60 in which a protrusion portion 70 is formed. For example, a mold having an inlet may be provided, and the mold may have protrusions disposed around the inlet.

For example, a protrusion portion may be disposed on the upper part of the mold 61. Alternatively, for example, a protrusion portion may be disposed on the lower portion of the mold 62. Alternatively, for example, protrusion poritons may be disposed on the upper part of the mold 61 and the lower part of the mold 62.

The shape and arrangement of the protrusions are the same as described above.

Next, electronic elements may be disposed at a predetermined position of the mold, and a molding material may be injected into the inlet.

For example, multiple electronic elements may be arranged in the mold cavity 63 of the transfer mold 60 in which the protrusion portion 70 is formed in the upper part of the mold 61 and/or the lower part of the mold 62, and the molding part of the element package 80 may be created by flowing molding materials into the mold cavity 63 and curing it.

The element package 80 may include a plurality of arranged electronic elements and a molding portion disposed to surround the electronic elements.

Since the description of the element package overlaps with the above description, a detailed description thereof will be omitted.

In addition, various types of protrusion can be formed in the mold.

For example, the protrusion disposed on the upper part of the mold 61 and/or the lower part of the mold 62 may be in the form of a triangular column with a triangular cross section. The protrusion may be formed in a form in which one surface of the triangular pillar is in contact with the upper part of the mold 61 and/or the lower part of the mold 62. Alternatively, for example, protrusions separated at regular intervals may be formed in the upper part of the mold 61 and/or the lower part of the mold 62. The protrusion may be disposed between the first electronic element and the second electronic element adjacent to each other in the element package 80.

In addition, for example, dimples may be disposed in the molding portion in the element package 80. For example, the dimple having various shapes may be disposed on the upper surface and/or the bottom surface of the molding portion.

For example, the dimple may be formed in a form in which one side, which is a square of a triangular column, contacts the upper part of the mold 61 and/or the lower part of the mold 62. Alternatively, for example, a plurality of dimple may be arranged in a dotted line when viewed from the first surface in the direction of the second surface. In this case, for example, dimples separated at regular intervals may be disposed on the upper part of the mold 61 and/or the lower part of the mold 62. The dimples may be disposed between the first electronic element and the second electronic element adjacent to each other in the element package 80.

Next, for example, referring to (b) of FIG. 11, the element package 80 may be disposed in the cavity portion 28.

For example, a glass core 21 may be attached to an adhesive film such as Polyimide Tape (PI tape), and the element package 80 may be placed on the cavity portion 28. The electronic element 40 of the element package 80 may include an active device such as a transistor or a power transmission device such as a capacitor, that is, a passive device.

Next, an insulating layer may be stacked on the glass core. An insulating layer may be formed by disposing and curing an insulating material on the glass core or the cavity portion.

For example, referring to (c) of FIG. 11, a process in which the upper insulating layer is laminated on the first surface of the glass core (21) may be performed (Lamination on Top).

If necessary, the adhesive film may be removed during a subsequent process. For example, the adhesive film may be an adhesive film capable of decreasing adhesion due to ultraviolet irradiation or the like.

The adhesive film can reduce the adhesion of the adhesive film by irradiating ultraviolet rays directly to the adhesive film or through the glass core, and can easily remove the adhesive film from the glass core.

Next, referring to (d) of FIG. 11, a process in which the lower insulating layer is laminated on the second surface of the glass core 21 may be performed (Lamination on bottom).

Thereafter, referring to (e) of FIG. 11, the upper insulating layer and the lower insulating layer may be pre-cured. The upper insulating layer may be included in the concave portion 81 and/or the cavity portion 28 of the element package 80.

The insulating material may be a mixture of a polymer resin, a polymer resin, and a filler (inorganic particles, organic particles, organic/inorganic composite particles, etc.).

For example, acrylic resins, epoxy resins, modified resins thereof, and the like may be applied to the polymer resin, and materials applicable to electronic devices for purposes such as molding may be applied. For example, a liquid crystal polymer (LCP) or the like may be applied.

For example, the above mixture material may be a mixture of acrylic resin and filler, a mixture of acrylic resin and epoxy resin and filler, a mixture of epoxy resin and filler, and the like. Inorganic particles may be applied to the filler, and silica particles may be applied as an example. As commercial products, ABF (Ajinomoto Build-up Film, ABF), Epoxy Molding Compound (EMC), and Modified Polyimide (MPI) can be applied, but are not limited thereto.

Specifically, the insulating material applied to the insulating layer may contain an insulating mixture. The insulating mixture may include inorganic particles and a polymer resin.

The insulating material may include Epoxy Molding Compound (EMC) and/or Ajinomoto Build-up Film (ABF).

The insulating material may flow, and a part thereof may be moved to a concave portion (dimple) on the cavity element.

In a cross section of the packaging substrate, the insulating layer and the cavity element may be distinguished from each other. That is, a boundary between the insulating layer and the element package may be observed. The boundary is observed in the cavity portion.

In one embodiment, the insulating layer and the element package are vertically stacked, and a molding material of an applied element package and an insulating material of an insulating layer can be substantially the same. In this case, it may be difficult to substantially distinguish a boundary between the insulating layer and the element package of the cavity element. That is, it may be practically difficult to observe the shape of the concave portion or of the dimple.

In another embodiment, the insulating layer and the cavity element may be vertically stacked, and a molding part of an applied element package and an insulating material may be separated from each other. In this case, in the cross section of the cavity, a boundary between the molding part and the insulating layer may be divided, and the boundary includes a concave part. The boundary may be easy to observe the shape of the concave portion or of the dimple.

The distinction between the molding part and the insulating layer can be generated by setting different pressures and temperatures to be cured even if the materials are substantially the same.

The boundary may be distinguished by applying different materials, and in this case, the boundary and the concave portion may be more easily distinguished from each other in the cross section of the cavity portion or of the dimple.

In the cross section, the boundary of color difference may be observed as a line.

In the cross section, the boundary can be observed in the form of a band (e.g., a color change such as gradation) in which the color has a relatively constant thickness. For example, the constant interval may be 2 to 30 μm, or 3 to 10 μm.

In the cross section, the boundary may be divided by including fillers of different sizes based on the boundary. In this way, it may be easier to control and control the stress of the glass core due to the difference in thermal expansion coefficient of the insulating material.

In this case, fillers having different sizes refer to fillers in which d50 measured using a particle size analysis method has different values.

The molding portion and the insulating layer may be made of a material having the same or different coefficient of thermal expansion (CTE). Preferably, a material with a small difference between the thermal expansion coefficient of the molding portion and the thermal expansion coefficient of the insulating layer can be applied.

The difference between the thermal expansion coefficient of the molding portion and the insulating layer may be 2 ppm/° C. or less, 1.5 ppm/° C. or less, 1 ppm/° C. or less, or 0.5 ppm/° C. or less. The difference in thermal expansion coefficients may be 0 ppm/° C. or more, 0.1 ppm/° C. or more, or 0.2 ppm/° C. or more.

The thermal expansion coefficient of the molding portion may be 8 ppm/° C. or more, 10 ppm/° C. or more, 12 ppm/° C. or more, or 14 ppm/° C. or more. The thermal expansion coefficient may be 20 ppm/° C. or less, 18 ppm/° C. or less, or 17 ppm/° C. or less The thermal expansion coefficient of the insulating layer may be 8 ppm/° C. or more, 10 ppm/° C. or more, or 12 ppm/° C. or more. The thermal expansion coefficient may be 20 ppm/° C. or less, 18 ppm/° C. or less, 16 ppm/° C. or less, or 14 ppm/° C. or less.

The molding portion and the insulating layer may be made of materials having different dielectric constants. Preferably, a material of the insulating layer may be selected and applied so that the dielectric constant of the molding part is low in the dielectric constant of the insulating layer.

The molding portion and the insulating layer may be formed of a material having a different relative dielectric constant Dk at a high frequency of 5.8 Ghz. For example, a difference between Dk of the molding portion and Dk of the insulating layer may be 0.1 or more. The difference in Dk may be 0.1 or more, 0.13 or more, 0.16 or more, or 0.2 or more. The difference in Dk may be 1 or less, 0.8 or less, 0.6 or less, 0.5 or less, 0.4 or less, 0.3 or less, or 0.25 or less.

The Dk of the molding portion may be 2.3 or more, 2.5 or more, 2.7 or more, or 2.9 or more. The Dk may be 3.4 or less, 3.2 or less, or 3.1 or less.

The Dk of insulating layer may be 3.0 or more, 3.1 or more, or 3.2 or more. The Dk may be 3.6 or less, 3.5 or less, or 3.4 or less.

The molding portion and the insulating layer may be made of a material having the same dielectric loss rate Df or different from each other. Preferably, a material with a difference of 0.0001 or more between Df of the molding portion and Df of the insulating layer can be applied. The difference in Dfs can be 0.0001 or more, 0.0005 or more, or 0.001 or more. The difference between the Dfs may be 0.02 or less. The Df of the molding portion can be 0.004 or less, 0.0038 or less, or 0.0036 or less. The Df can be 0.001 or more, 0.0015 or more, 0.0018 or more, or 0.002 or more.

The Df of the insulating layer can be 0.005 or less, 0.0048 or less, or 0.0046 or less. The Df can be 0.003 or more, 0.0032 or more, or 0.0034 or more.

ABF may be applied to the insulating layer and LCP may be applied to the molding portion, for example. For example, EMC may be applied to the insulating layer and LCP may be applied to the molding portion. For example, ABP having a dielectric constant different from each other may be applied to the insulating layer and the molding portion.

The manufacturing method of the packaging substrate according to the above-described embodiments and the packaging substrate using the same can prevent a phenomenon of leaving the arranged position while embedding multiple devices by inserting an element package generated using a mold with a protrusion into the cavity.

Accordingly, the arranged position of the devices may be maintained through the element package in which the concave portion is disposed in a part of the molding portion, and contact between the elements is prevented, thereby preventing a problem such as a short circuit.

The present specification described above has been described with reference to the embodiments shown in the drawings, but this is merely exemplary, and those skilled in the art will understand that various modifications and variations of the embodiments are possible. That is, the scope of the present specification is not limited to the above-described embodiments, and various modifications and improved forms by those skilled in the art using the basic concepts of the embodiments defined in the following claims also belong to the scope of the embodiments. Accordingly, the true technical scope of the present specification should be defined by the technical spirit of the appended claims.

What is claimed is:

1. A packaging substrate comprising, a core layer comprising a glass core and a cavity portion, wherein the glass core is a glass substrate having a first surface and a second surface facing each other, the cavity portion has an accommodation space for accommodating an element package as a part of the glass core is recessed or penetrated, and the element package is placed in the accommodation space of the cavity portion, wherein the element package comprises i) a plurality of arranged electronic elements; and ii) a molding portion containing a molding material and the molding portion arranges for the molding material to surround the electronic elements, and a concave portion having arranged dimples is disposed in some of the molding portion at the element package, the packaging substrate further comprising an insulating layer disposed on the cavity portion, wherein an insulating material of the insulating layer is recessed in the dimples of the concave portion.

2. The packaging substrate of claim 1, wherein the dimple is disposed between the electronic elements adjacent to each other.

3. The packaging substrate of claim 1, wherein the concave portion comprise a plurality of dimples arranged in a dotted line shape in view of the direction from the first surface and the second surface.

4. The packaging substrate of claim 1, wherein the molding material contains liquid crystal polymer, epoxy molding compound, Ajinomoto build-up film, or Modified Polyimide.

5. The packaging substrate of claim 1, wherein the insulating layer contains an insulating mixture, and the insulating mixture comprising inorganic particles and a polymer resin.

6. The packaging substrate of claim 1, wherein a boundary between the molding portion and the insulating layer is in the cavity portion, and at the boundary, concave dimples are disposed in the direction of the electronic element.

7. A method of manufacturing a packaging substrate comprising:

preparing operation of preparing a glass core with a cavity portion and an element package, arranging operation of arranging the element package in the cavity portion, and forming operation of forming an insulating layer by placing and curing an insulating material on the glass core or the cavity portion, wherein the packaging substrate is according to claim 1.

8. The method of claim 7, wherein, in the forming operation, the insulating material flows and a part of the insulating material moves to the concave dimples at the cavity portion.

9. A method of manufacturing an element package, comprising:

an element arrangement operation in which a mold with an inlet is prepared and electronic elements are disposed at a predetermined position on the mold, an injection operation of injecting molding material into the inlet, and a mold forming operation of forming a molding portion by curing the molding material and thereby forming the element package, and wherein the mold has a protrusion portion having arranged protrusions around the inlet, and wherein the element package comprises i) a plurality of arranged electronic elements; and ii) a molding portion containing a molding material and the molding portion are disposed to surround the electronic devices; and the element package has a concave portion having arranged dimples which is disposed in a part of the molding portion; and, the concave portion and the protrude portion are correspond to their positions.

10. The method of claim 9, wherein, at the element arrangement operation, the electronic elements are disposed on the adhesive surface to be fixed in position, and wherein, at the mold forming operation, a position where the electronic elements are disposed is substantially the same as the position disposed in the device arrangement operation.

11. The method of claim 9, wherein the protrusions are disposed between the electronic devices adjacent to each other.

12. The method of claim 9, wherein the element package is produced by a transfer molding process using a transfer mold with a protrusion portion formed on the mold.

* * * * *